United States Patent
Korsunsky et al.

(10) Patent No.: US 7,188,408 B2
(45) Date of Patent: Mar. 13, 2007

(54) METHOD OF MAKING A STRADDLE MOUNT CONNECTOR

(75) Inventors: Iosif R. Korsunsky, Harrisburg, PA (US); Joanne E. Shipe, Harrisburg, PA (US); Robert W. Brown, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 376 days.

(21) Appl. No.: 10/335,285

(22) Filed: Dec. 31, 2002

(65) Prior Publication Data

US 2004/0123458 A1     Jul. 1, 2004

(51) Int. Cl.
*H05K 3/20*     (2006.01)

(52) U.S. Cl. .............................. 29/831; 29/843; 29/876; 29/878; 29/884; 439/67; 439/79; 439/607; 228/180.22

(58) Field of Classification Search .................. 29/831, 29/854, 863, 867, 874, 876, 883, 842, 843, 29/879; 361/787, 785, 791, 803; 439/19, 439/79, 101, 108, 59, 67, 80, 82, 83, 260, 439/328, 439, 607, 636, 947; 228/180.22
See application file for complete search history.

(56) References Cited

U.S. PATENT DOCUMENTS

| | | | | |
|---|---|---|---|---|
| 4,992,052 A | * | 2/1991 | Verhoeven | 439/79 |
| 5,088,009 A | * | 2/1992 | Harada et al. | 361/787 |
| 5,383,095 A | * | 1/1995 | Korsunsky et al. | 29/845 |
| 5,536,179 A | * | 7/1996 | Olsson et al. | 439/108 |
| 6,296,496 B1 | * | 10/2001 | Trammel | 439/79 |
| 6,692,273 B1 | * | 2/2004 | Korsunsky et al. | 439/108 |

* cited by examiner

*Primary Examiner*—Minh Trinh
*Assistant Examiner*—Donghai D. Nguyen
(74) *Attorney, Agent, or Firm*—Wei Te Chung

(57) ABSTRACT

A method of making an electrical connector includes the steps of: providing a connector body (2) having an insert (5) defining a recessed area (54a) at one side and a number of channels (54b) at an opposite side; assembling a ground bus (4) to the recessed area of the insert, the ground bus including a carrier strip (46) with a number of fingers (460) extending therefrom; assembling a number of signal contacts (3) to the channels of the insert, each signal contact including a board mounting portion (32); and displacing the carrier strip such that each finger extends into space (320) between the mounting portions of two adjacent signal contacts.

2 Claims, 13 Drawing Sheets

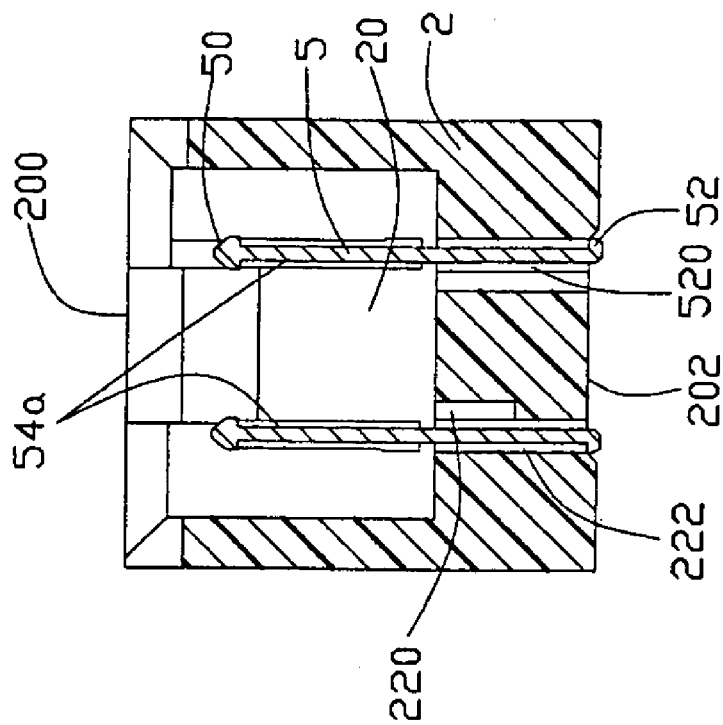
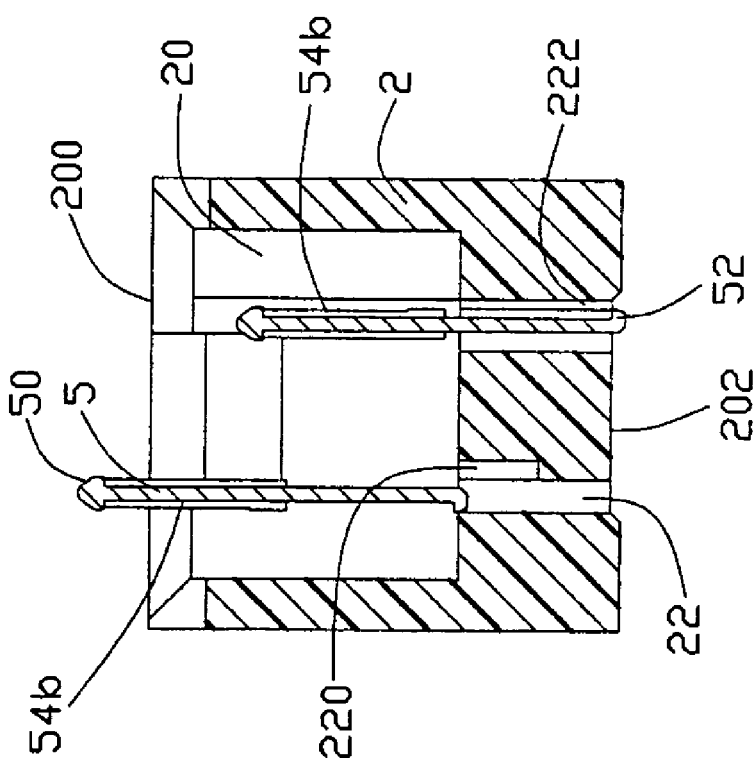
FIG. 7B
FIG. 7A

FGI. 11

METHOD OF MAKING A STRADDLE MOUNT CONNECTOR

CROSS-REFERENCE TO RELATED APPLICATIONS

This patent application is related to two other contemporaneously filed U.S. patent applications entitled "STRADDLE MOUNT CONNECTOR" and entitled "GROUND BUS FOR AN ELECTRICAL CONNECTOR", invented by the same inventors as this patent application, and all assigned to the same assignee with this application.

BACKGROUND OF THE INVENTION

1. Field of the Invention

The present invention relates to a method, and more particularly to a method of making a straddle mount connector in which a lead-in is formed by displacing a carrier strip of a ground bus inserted into the connector.

2. Description of Related Art

There are commonly numerous electrical connectors available from the market and which are mounted to a printed circuit board (PCB) of an electronic device for implementing different functions. In order to meet the needs of the trend toward miniaturizaiton, the overall size of the electronic device becomes smaller and smaller. Consequently, a printed circuit board mounted within the device becomes small as well. Conversely, while the dimensions of the device decrease, the functions of the device are often increasing. As such, there is a need to install more and more connectors within a limited area of the printed circuit board. In order to mount more and more connectors on the printed circuit board without increasing the surface area, the dimension of the connector must be reduced. This means the terminal pitch within the connector has to be reduced as well. As such, a high-density connector is required.

In the early stages of the progression toward high density placement of the connectors, through-hole mounting technology was used. Mounting portions of the terminals were placed in through holes of the circuit board and held in place by soldering or some type of mechanical engagement of the pin with sidewalls of the through hole. As the need for high density of the connector increased, the number of through holes required also increased. However, since the diameter of the through holes is relatively large, only a limited number of through holes could be provided in a given area. Therefore, through-hole technology could not meet the requirement for high density applications.

In order to provide for a higher density of connectors on the board, surface mount technology has been utilized. Some surface mount connectors can be referred to U.S. Pat. No. 5,813,871 issued to Grabbe et al. on Sep. 29, 1998 and U.S. Pat. No. 5,860,814 issued to Akama et al. on Jan. 19, 1999. Because no through holes are required, conductive pads on the printed circuit board can be closely spaced, thereby allowing a connector with condensed terminals to be mounted in an area of the board which would be impossible for a through-hole version.

As the progression toward higher density continues, it has become imperative that every possible area of the printed circuit board be effectively utilized. A straddle mount connector located on an edge of the printed circuit board is then developed to occupy a minimal board area. Additionally, with the trend of high speed signal transmission, the straddle mount connector generally employs a ground bus to provide a ground reference to signal contacts from for improved signal integrity at higher speeds. Such a straddle mount connector can be referred to U.S. Pat. No. 5,320,541 issued to Korsunsky et al. on Jun. 14, 1994, U.S. Pat. No. 5,199,885 issued to Korsunsky et al. on Apr. 6, 1993 and U.S. Pat. No. 5,120,232 issued to Korsunsky on Jun. 9, 1992.

Referring to FIG. 5 of U.S. Pat. No. 5,199,885, a straddle mount connector is disclosed therein and comprises an insulating housing having a mating surface and an opposite mounting surface. The housing defines a recess in the mating surface for receiving a mating connector therein, two rows of cavities extending from the mounting surface to the recess and a slot extending from the recess to proximate the mounting surface along a longitudinal direction thereof. A plurality of signal contacts is inserted into the cavities from the mounting surface of the housing with terminal portions extending out of the mounting surface so as to mount the connector to an edge of a printed circuit board in a straddle. A ground bus is inserted into the slot from the mating surface of the housing with solder tails penetrating through the mounting surface. When the terminal portions of the signal contacts slide over opposite side surfaces of the printed circuit board, the solder tails of the ground bus are inserted into plated openings in an edge surface of the printed circuit board, thereby establishing an electrical connection between the ground bus and the printed circuit board.

It is quite difficult to form the opening in the edge surface of the printed circuit board, thereby complicating the manufacturing process.

U.S. Pat. No. 6,231,355 issued to Trammel et al. discloses a straddle mount connector with the ground bus also straddle mounted on the printed circuit board for addressing to the problem encountered by the '885 patent. However, in order to minimize the PCB used for signal contacts, the lead-in of the signal terminal portions for placement on the edge of the PCB is abbreviated. This leads to a potential stubbing condition upon placement, particularly because the leads are proportioned to be flexible. This flexibility also results in less accurate side-to-side placement of the leads on presoldered pads of the printed circuit board. In addition, the ground bus does not provide a robust lead-in for receiving the inserted printed circuit board. Trammel further discloses other solutions to the captioned connector, such as disclosed in U.S. Pat. Nos. 6,296,496 and 6,419,502 which are believed relevant to the present invention.

Further, the contact pitch of the high density connector is so small so as to create a possibility of "arcing" between the terminal portions of the signal contacts and adjacent solder tails of the ground bus. In order to avoid and prevent this shortcoming, the terminal portions of the signal contacts and the solder tails of the ground bus are kept at a safe distance. However, when the solder tail of the ground bus is cut short to keep this safe distance relative to the terminal portion of the signal contact, the end of the solder tail of the ground bus is almost in alignment with the inserted printed circuit board as the lead-in is cut-off. This will create great difficulty during the assembly because a front edge of the printed circuit board may easily abut against the solder tails unless the printed circuit board is kept completely and perfectly horizontally with respect to a plane defined by the solder tails. This no doubt increases the difficulty of assembly.

In addition, when the pitch of the contact of the connector becomes smaller and smaller, keeping the terminal portions of the contact in accurate spacing at all times, including handling and delivery, is a challenge to the manufacturer. If the pitch of the contacts is varied or displaced during handling and delivery, it will be impossible to achieve an accurate alignment between the terminal portions and the conductive pads of the PCB on which the connector is mounted. How to keep those terminal portions of the connector accurately aligned with the conductive pads of the printed circuit board even during the assembly is really a challenge to the manufacturer.

The present invention aims to provide a method of making an improved straddle mount connector which can overcome the disadvantages of the related art.

SUMMARY OF THE INVENTION

Accordingly, it is an object of the present invention to provide a method of making a straddle mount connector which can be easier application to a printed circuit board and can keep signal contacts accurately aligning with corresponding conductive pads on the printed circuit board.

In order to achieve the object set forth, a method of making an electrical connector in accordance with the present invention comprises the steps of: providing a connector body having an insert defining a plurality of channels at one side and a recessed area at an opposite side; assembling a ground bus to the recessed area of the insert, the ground bus including a carrier strip with a plurality of fingers extending therefrom; assembling a plurality of signal contacts to the channels of the insert, each signal contact including a board mounting portion; and displacing the carrier strip such that each finger extends into space between the mounting portions of two adjacent signal contacts.

Other objects, advantages and novel features of the invention will become more apparent from the following detailed description when taken in conjunction with the accompanying drawings.

BRIEF DESCRIPTION OF THE DRAWINGS

FIGS. 7A and 7B are cross-sectional views showing the insulating inserts installed into a dielectric housing of the straddle mount connector of FIG. 1;

DETAILED DESCRIPTION OF THE INVENTION

Reference will now be made in detail to the preferred embodiment of the present invention.

Figure 1:
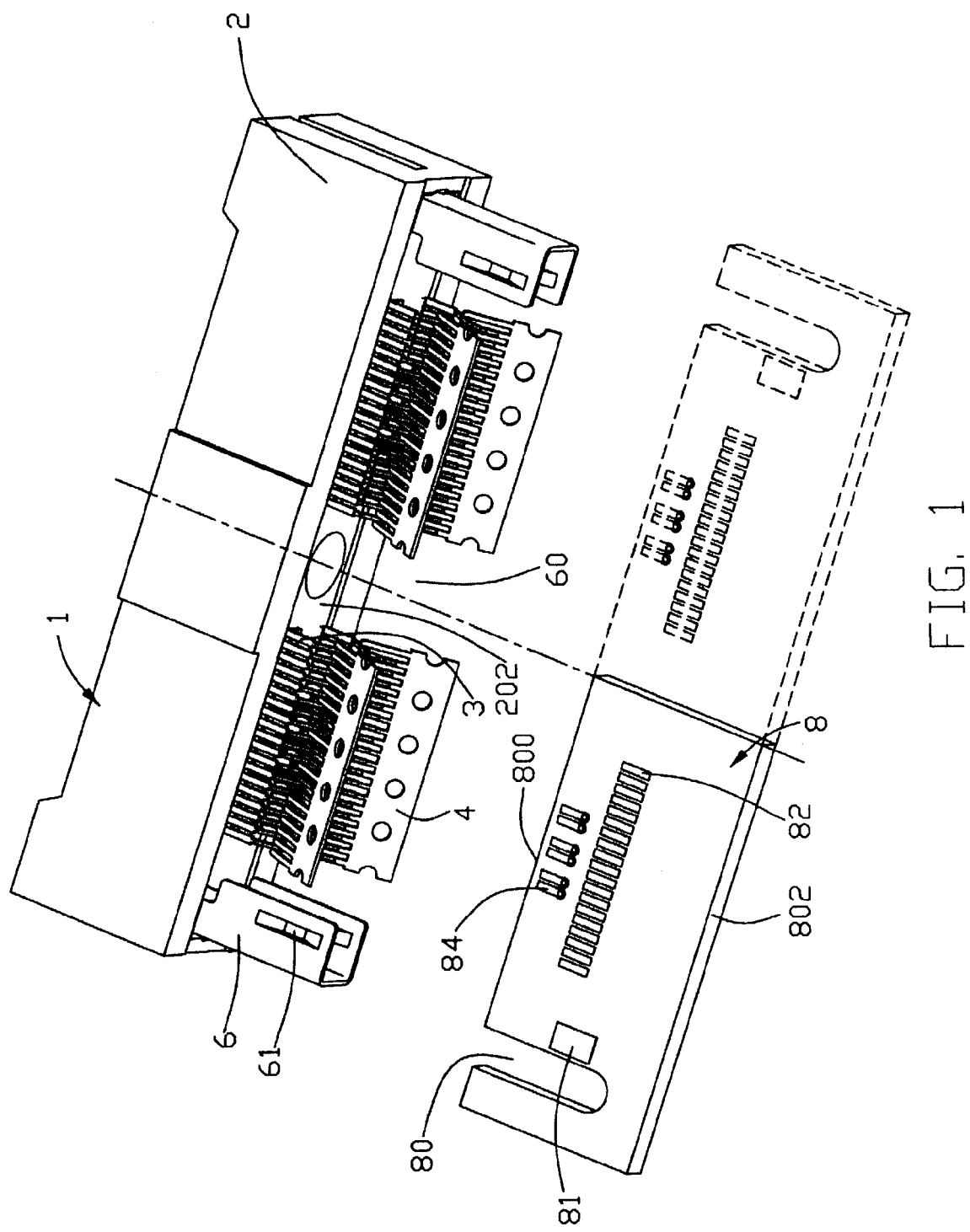
FIG. 1 is a perspective view of a straddle mount connector made by a method in accordance with the present invention and a printed circuit board on which the connector is to be straddle mounted.

FIG. 1 shows a straddle mount connector 1 in accordance with the present invention and a printed circuit board 8 on which the connector 1 is to be straddle mounted. For simplicity, only a half of the printed circuit board 8 is shown. It should be noted that this is not a limitation for the embodiment. The printed circuit board 8 defines a pair of channels 80 extending from a mounting edge 800 toward the opposite edge 802 and a plurality of signal pads 82 and ground pads 84 arranged in a staggered manner on opposite sides thereof. The ground pads 84 are closer to the mounting edge 800 of the printed circuit board 8 than the signal pads 82.

Figure 2:
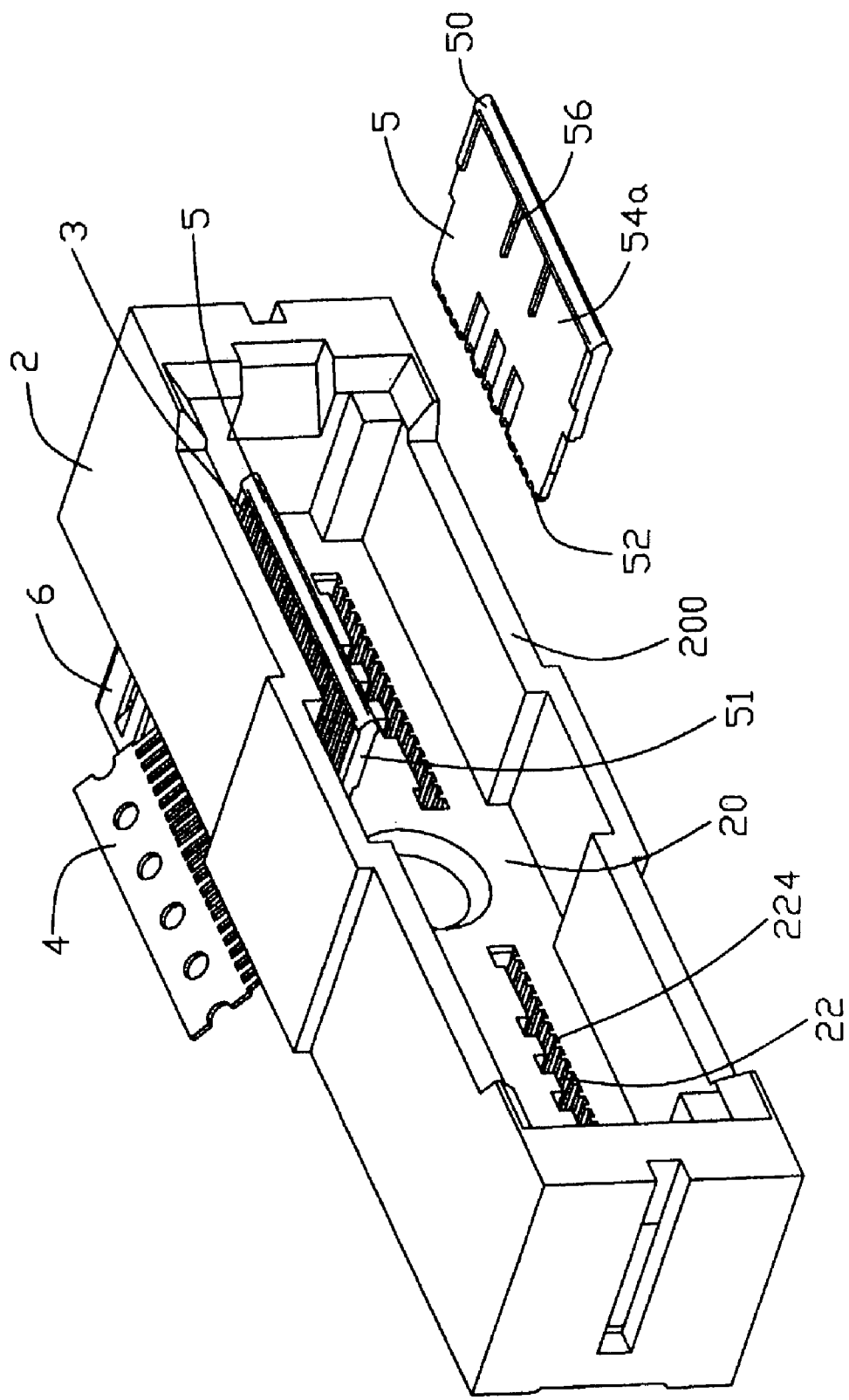
FIG. 2 is a top, partially exploded view of the straddle mount connector of FIG. 1.
Figure 3:
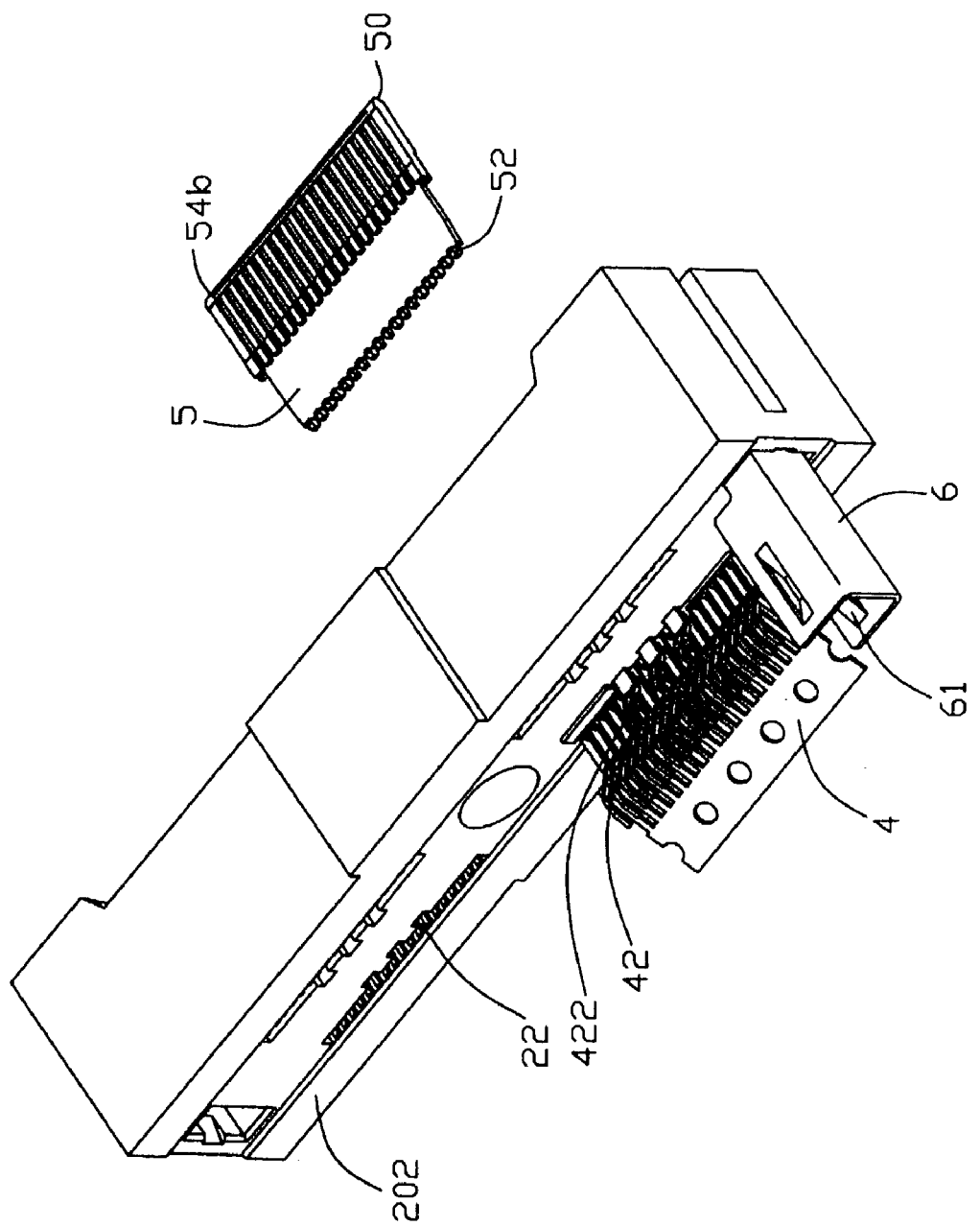
FIG. 3 is a bottom, partially exploded view of the straddle mount connector of FIG. 1.
Figure 4:
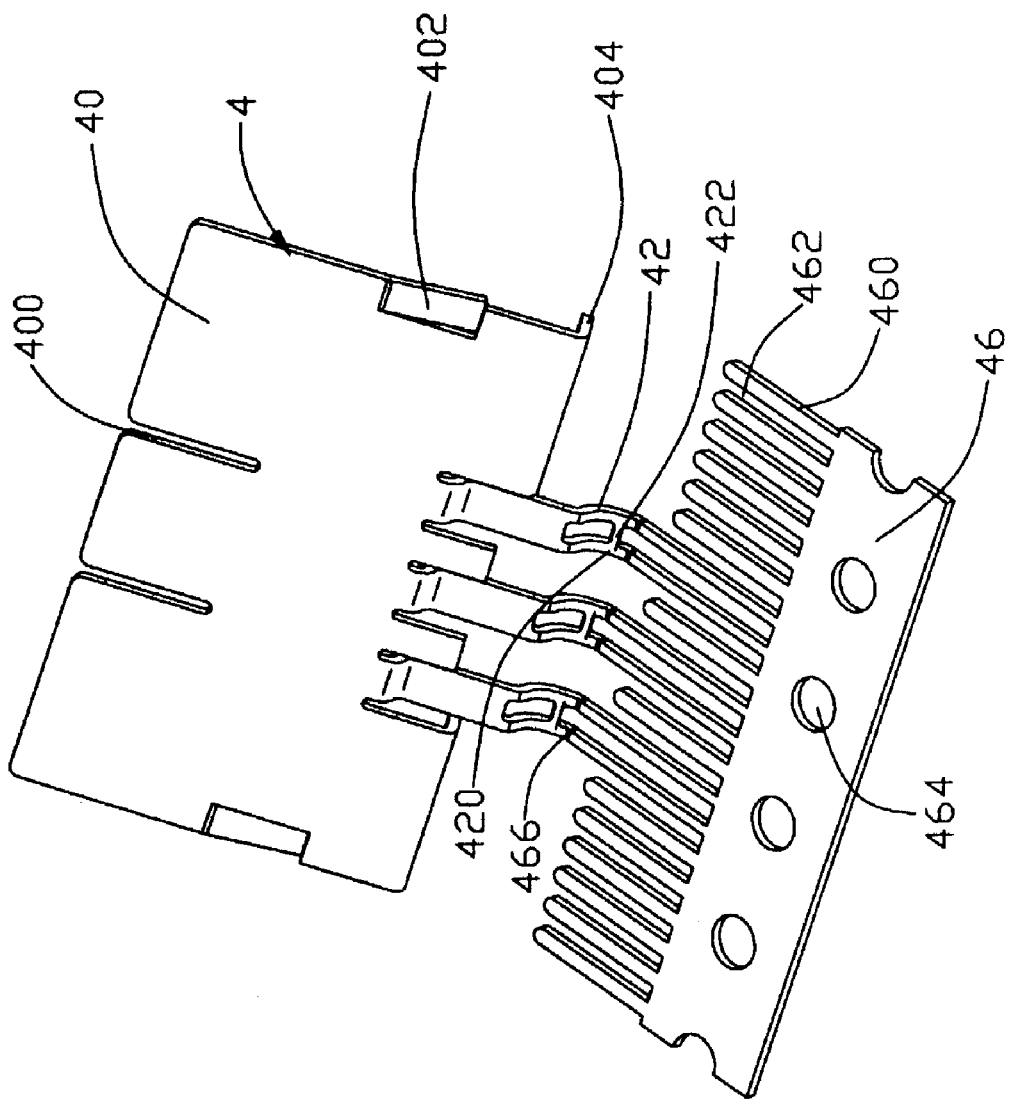
FIG. 4 is an enlarged perspective view of a ground bus of the connector.
Figure 5:
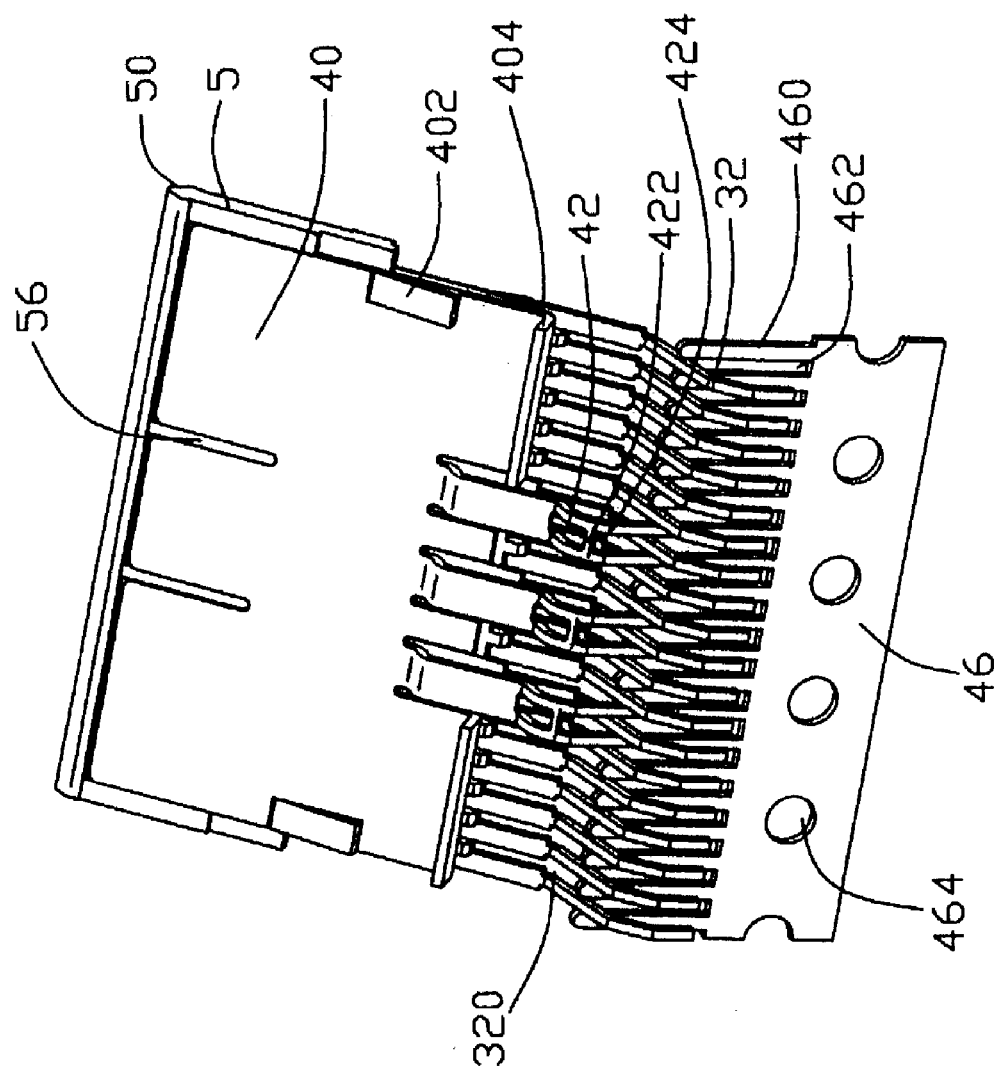
FIG. 5 is an enlarged perspective view showing the ground bus and signal contacts attached on an insulating insert of the connector.
Figure 6:
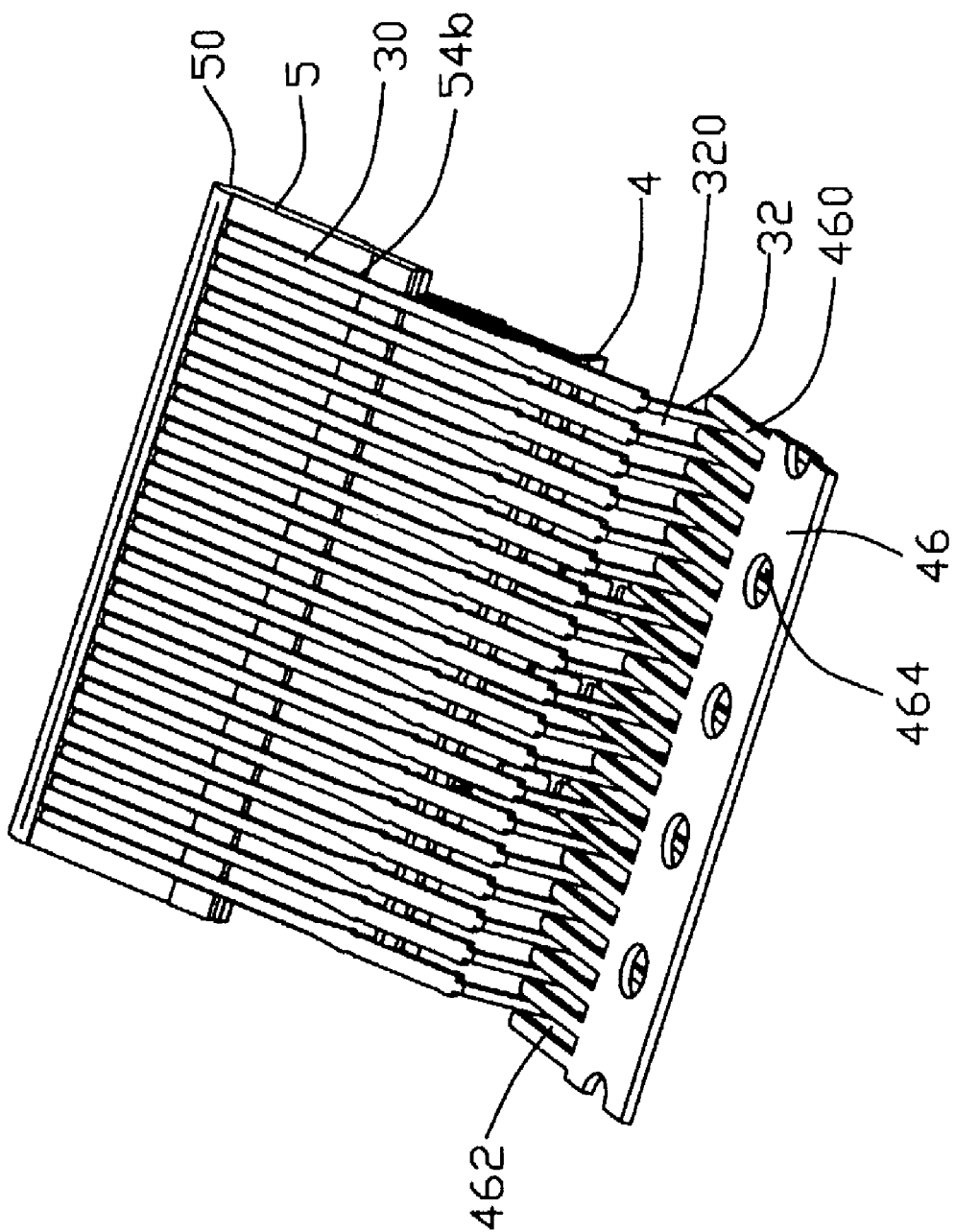
FIG. 6 is a view similar to FIG. 5 but taken from a different perspective.
Figure 8B:
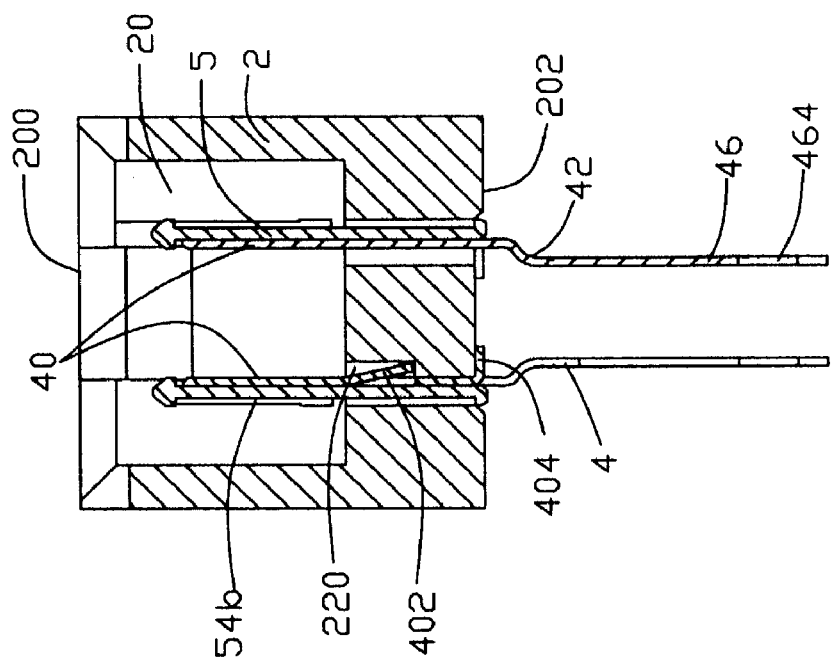
FIGS. 8A and 8B are cross-sectional views showing the ground bus with carrier strips installed into the dielectric housing along an inner side of each insert.
Figure 8A:
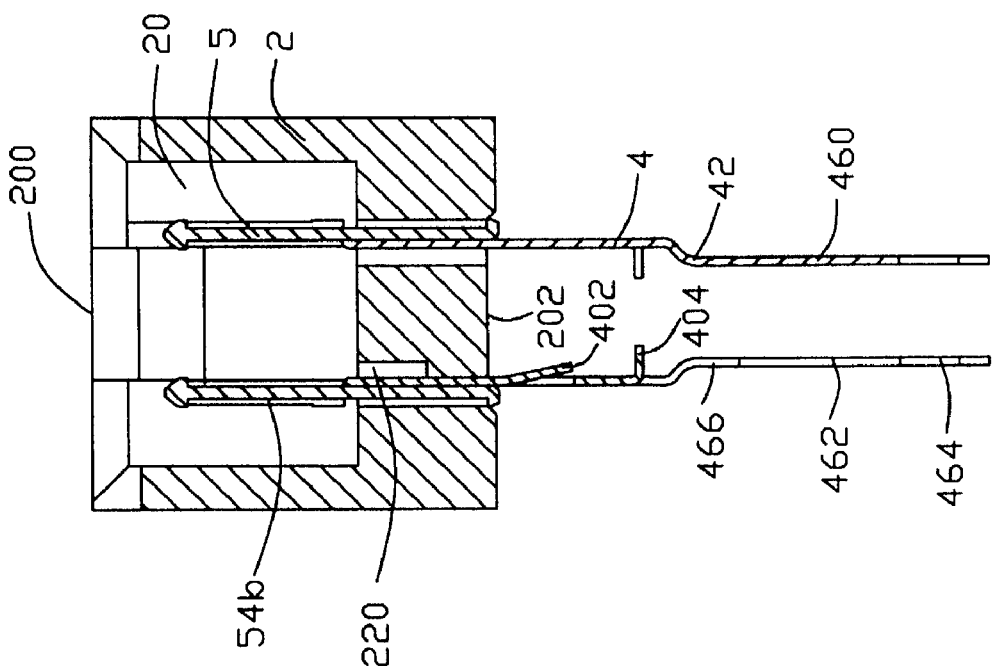

Further referring to FIGS. 2 and 3, the connector 1 comprises an elongated dielectric housing 2 with two rows of signal contacts 3 and a pair of ground buses 4 provided therein for electrical connection with the printed circuit board 8. The housing 2 defines a receiving space 20 in a top mating surface 200 along a longitudinal direction thereof for receiving a mating connector (not shown) therein and cavities 22 in a bottom mounting surface 202 communicating with the receiving space 20. The cavities 22 of one pair are provided on opposite sides of the longitudinal axis of the housing 2. The housing 2 further defines slits 220 (FIG. 7A) on an inner surface of the cavity 22 and ribs 222 on an outer surface of the cavity 22 to form channels 224 therebetween.

A pair of anchor clips 6 is employed to be positioned on opposite ends of the dielectric housing 2 to provide mechanical rigidity during the assembly and in use of the connector 1 onto the printed circuit board 8. The pair of anchor clips 6 define a receiving space 60. The anchor clip 6 is made of metal so as to perform additional ground or power function when needed. In doing so, the clip 6 is further formed with a footer 61 so as to electrically connected to a corresponding pad on the printed circuit board 8. The metal clip 6 provides more rigidity as compared to plastic. However, if the clip 6 is made from plastic, it is preferably coated with a conductive material so as to provide additional ground to the whole system.

A pair of insulating inserts 5 is assembled into the housing 2 for assembling the signal contacts 3 and the ground bus 4 into the housing 2. Even though a pair of inserts 5 is disclosed, however, it is noted that variation can be made according to different applications. In the preferred embodiment, each pair of the inserts 5 is substantially identical in structure, for simplicity, only a pair of the inserts 5 is shown in FIG. 1 through FIG. 13.

Referring to FIGS. 2, 3, 7A and 7B, each insert 5 is generally of a plate configuration defining a chamfer 50 at a top end for facilitating engagement with the mating connector and hooks 52 at a bottom end thereof. The insert 5 has a recessed area 54a for receiving the ground bus 4 on a first side and a mating tongue 51 defining a plurality of parallel channels 54b for receiving the signal contacts 3 on an opposite second side. The insert 5 has projections 56 formed adjacent to the top end thereof. Each insert 5 is dimensioned to be first ZIF (Zero Insertion Force) inserted into the corresponding cavity 22 from the top mating surface 200 of the housing 2 and then moved outwardly to allow the hooks 52 latching the ribs 222 of the housing 2, whereby the insert 5 is pre-positioned in the housing 2. The mating tongue 51 of the insert 5 extends into the receiving space 20 of the housing 2 for engagement with the mating connector. A slit 520 is thus formed between the housing 2 and the first side of the insert 5. The slit 520 has a width slightly smaller than that of the ground bus 4. At the same time, the channel 54*b* of the insert 5 and the channel 224 of the housing 2 together form passageways for receiving the signal contacts 3.

Referring to FIGS. 4, 5, 8A and 8B, the ground buses 4 are loaded into the housing 2 from the bottom mounting surface 202 along the first sides of the inserts 5. Since the width of the ground bus 4 is larger than that of the slit 520, the insert 5 is further pushed toward the ribs 222 of the housing 2 during the assembly of the ground bus 4 into the housing 2, thereby securely retaining the insert 5 in the housing 2.

The ground bus 4 is directly stamped from a conductive sheet material. In order to facilitate assembly of the connector 1 to the printed circuit board 8 by forming a lead-in 424 on the ground bus 4, the ground bus 4 is accompanied with a carrier strip 46 so as to ensure certain functions. As will be described hereinafter, the lead-in 424 of the ground bus 4 is ideally formed by displacement of the carrier strip 46 after the signal contacts 3 are assembled to the housing 2. The lead-in 424 is used for eliminating stubbing during the assembly of the connector 1 onto the printed circuit board 8. The carrier strip 46 defines a row of round holes 464 therein for engaging with a driving wheel whereby the carrier strip 46 can be moved by the driving wheel in the continuous stamping process.

The ground bus 4 includes a plurality of solder tails 42 extending from an edge of the carrier strip 46, a ground plane body 40 extending from the solder tails 42 and a plurality of finger 460 extending from the edge of the carrier strip 46 to define a plurality of slits 462 therebetween. The ground plane body 40 is positioned in the corresponding recessed area 54*a* of the insert 5 for electrically engaging with a corresponding ground contact of the mating connector. The solder tails 42 extend beyond the mounting surface 202 for soldering to the printed circuit board 8. The plane body 40 has a pair of openings 400 at a top end to receive the projections 56 of the insert 5 for guiding the insertion of the ground bus 4 and adding stability in use. The ground bus 4 further includes spring tabs 402 stamped from the plane body 40 to be received in the slits 220 of the housing 2 and tangs 404 extending perpendicularly from the plane body 40 to abut against the mounting surface 202 of the housing 2 for securely retaining the ground bus 4 in the housing 2.

Each solder tail 42 has a solder joint 420 for electrical connection to the printed circuit board 8. According to the application, the solder tails 42 are formed in pair and each is a thin section. As such, in order to increase rigidity of the solder tails 42, the solder tails 42 of each pair are bridged with a cross bar 422 at the solder joints 420 which is further soldered to the ground pad 84 of the printed circuit board 8. The provision of the cross bar 422 may further increase the size of the solder joint between the solder tails 42 and the ground pad 84. This increased solder joint will serve as a solid anchor when the carrier is removed after the connector 1 is soldered to the printed circuit board 8. This will be further discussed hereinafter.

The ground bus 4 has V-cuts 466 formed adjacent to the cross bar 422 of the solder tails 42 for removing the carrier strip 46 after the connector 1 is soldered to the printed circuit board 8.

Figure 9B:
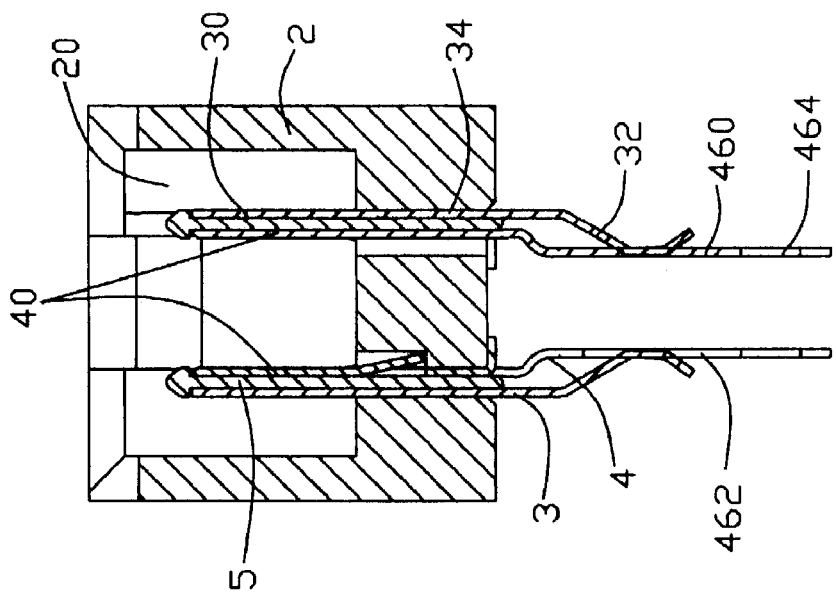
FIGS. 9A and 9B are cross-sectional views showing the signal contacts installed into the dielectric housing along an outer side of each insert.
Figure 9A:
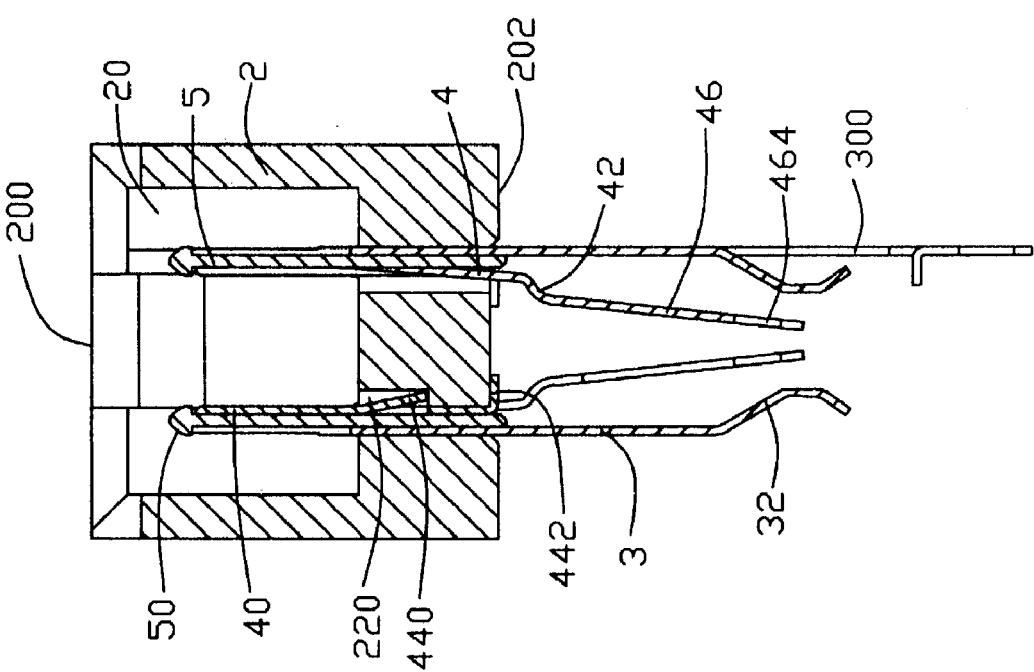

Referring to FIGS. 9A and 9B, after the carrier strips 46 are slightly bent inwardly, each row of the signal contacts 3 are then simultaneously inserted into the housing 2 via a signal carrier strip 300 from the bottom mounting surface 202 along the second sides of the inserts 5. Each signal contact 3 includes a mating portion 30 received in the channel 54*b* on the mating tongue 51 of the insert 5 for electrically engaging with a corresponding signal contact of the mating connector, a terminal portion 32 extending beyond the mounting surface 202 for soldering to the printed circuit board 8 and an intermediate portion 34 received in the channel 224 of the housing 2. The terminal portion 32 of the signal contacts 3 are substantially in alignment with the slits 462 of the carrier strips 46.

Figure 10:
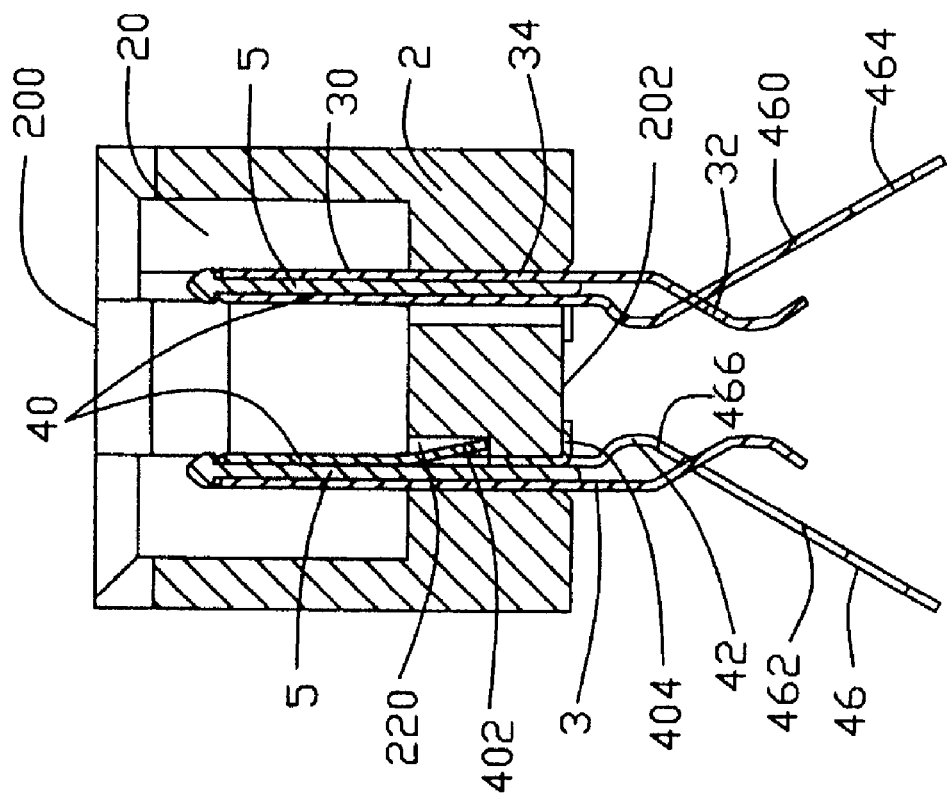
FIG. 10 is a cross-sectional view showing the carrier strips of the ground bus in an angular fashion.

Referring to FIG. 10, after the signal contacts 3 are assembled in the housing 2 and with the signal carrier strip 300 removed therefrom, the carrier strips 46 of the ground buses 4 are then bent outwardly to allow the terminal portions 32 of the signal contacts 3 extending through the slits 462 between the fingers 460 of the carrier strips 46, whereby the fingers 460 of the carrier strips 46 are accordingly extended into space 320 (FIG. 5) between every two adjacent terminal portions 32 and are positioned between the terminal portions 32 to keep the signal contacts 3 organized. It is noted that the lead-in 424 of the ground bus 4 is thus formed when the carrier strip 46 is bent outwardly to keep the signal contacts 3 organized.

Figure 11:
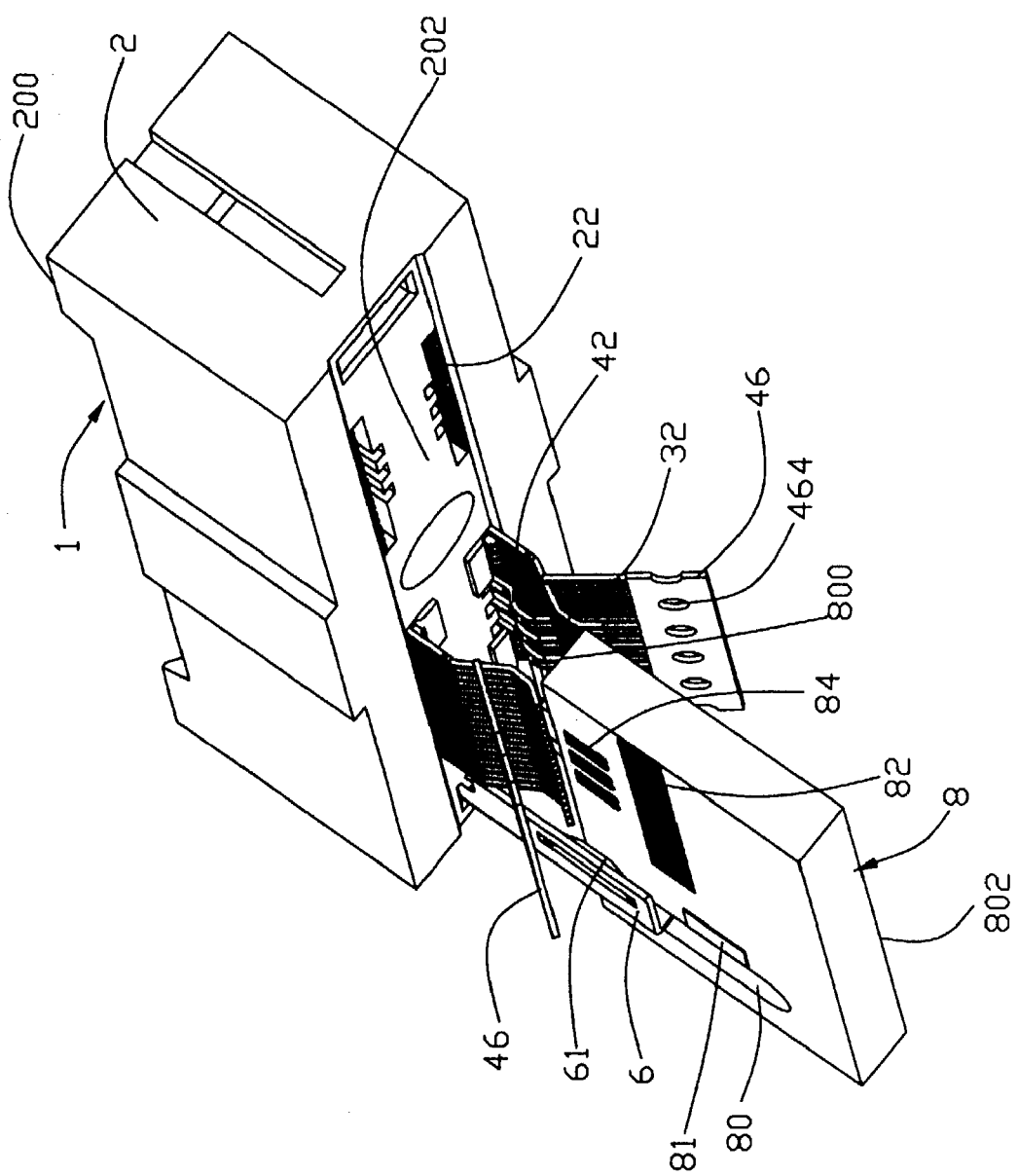
FIG. 11 is a perspective view showing the printed circuit board being inserted into the connector of FIG. 1.
Figure 12:
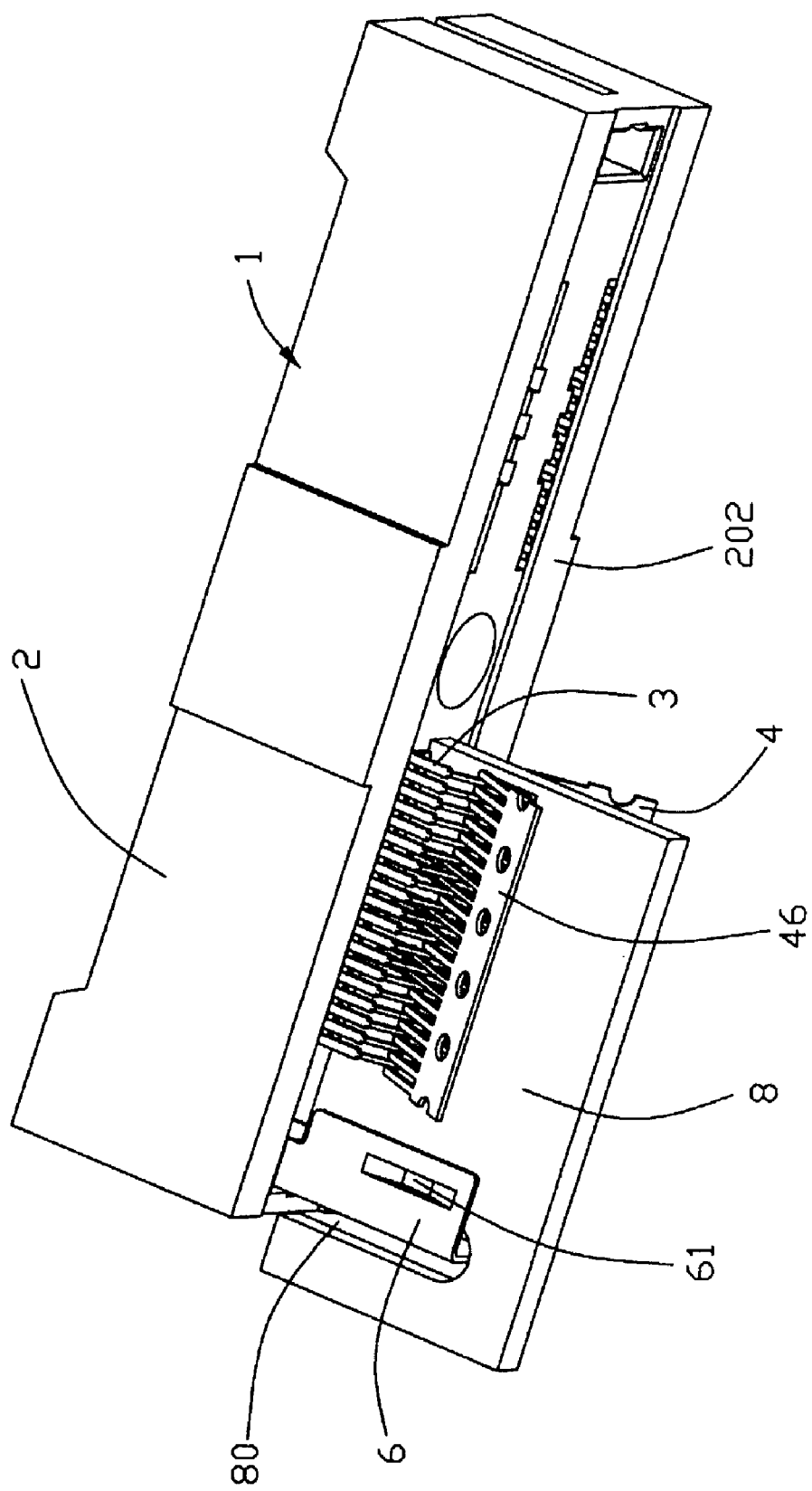
FIG. 12 is a perspective view showing the connector of FIG. 1 mounted on the printed circuit board.
Figure 13:
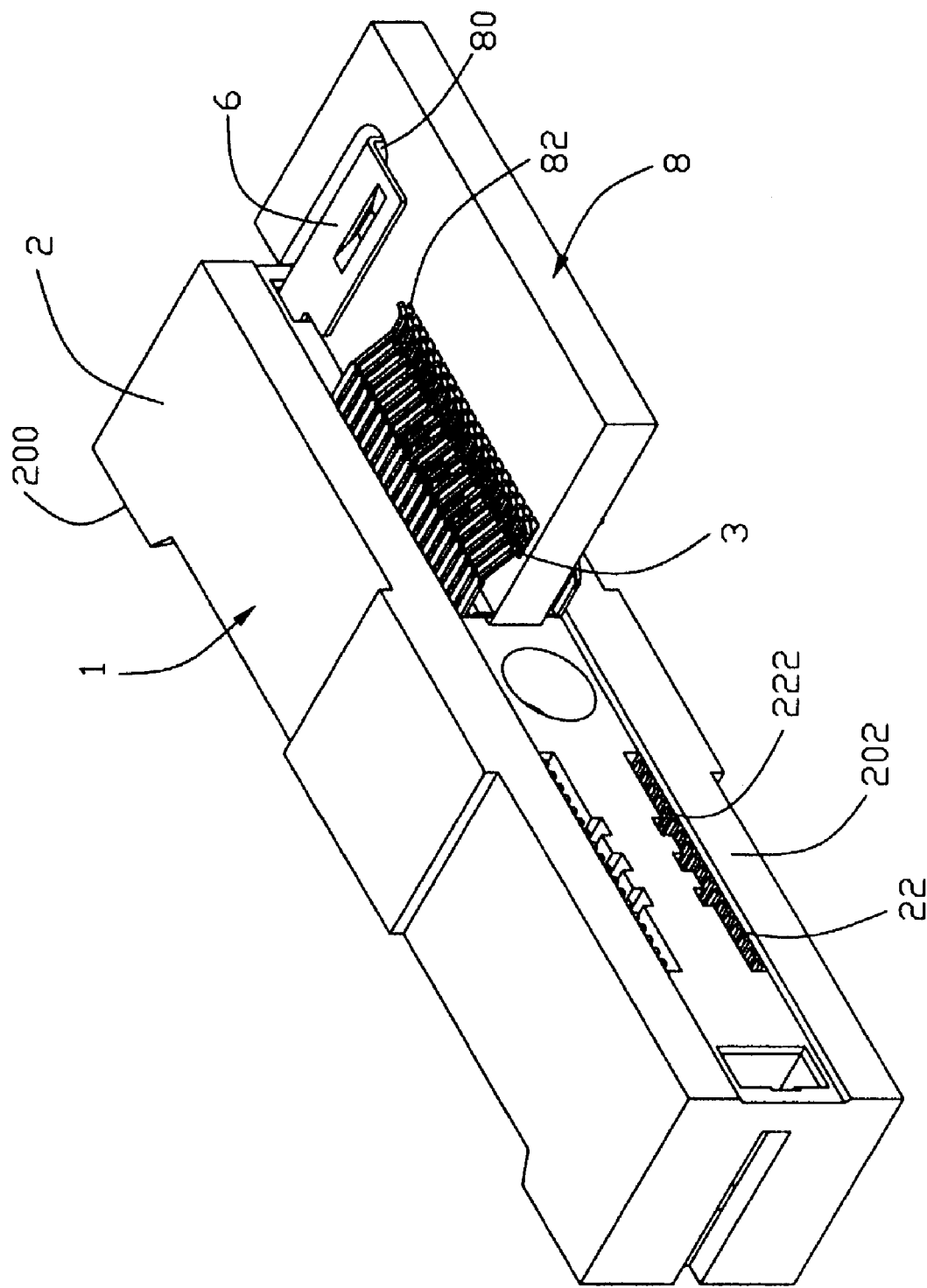
FIG. 13 is a view similar to FIG. 12 but showing the carrier strips removed from the ground bus.

Referring to FIGS. 11–13, when the electrical connector 1 is assembled to the printed circuit board 8 from the mounting edge 800, the anchor clip 6 is received in the channel 80 for providing a vertical alignment for the inserted printed circuit board 8. By this arrangement, the terminal portions 32 of the signal contacts 3 and the solder tails 42 of the ground bus 4 are respectively accurately aligned with the signal pads 82 and the ground pads 84 on the printed circuit board 8. During the assembly of the printed circuit board 8 to the electrical connector 1, the carrier strips 46 of the ground buses 4 provide lead-in capability for easier reception to the printed circuit board 8 by bending outwardly. Once the mounting edge 800 of the printed circuit board 8 abuts against the mounting surface 202 of the dielectric housing 2, the terminal protions 32 of the signal contacts 3 and the solder tails 42 of the ground bus 4 are respectively positioned on the signal pads 82 and the gound pads 84 onthe opposite sides of the printed cuircuit board 8 benefited by the footer 61 of the anchor clip 6 received within a corresponding slot 81 of the printed circuit board 8. After the terminal portions 32 and the solder tails 34 are respectively soldered on the signal pads 82 and the ground pads 84, the carrier strips 46 of the ground buses 4 are removed at the V-cuts 466. Since the signal pads 82 and the ground pads 84 on the printed circuit board 8 are arranged in a staggered manner, the terminal portions 32 of the signal contacts 3 do not interfere with the ground pads 84 during the assembly of the connector 1 onto the printed circuit board 8.

The solder tails 42 of the ground buses 4 are located between the two rows of the terminal portions 32 of the signal contacts 3 and have a low profile after the carrier strip 46 is removed therefrom. Thus, the board real estate is still saved although the solder tails 42 of the ground buses 4 are soldered on the opposite sides of the printed circuit board 8.

It is noted that the carrier strip 46 of each ground bus 4 can provide lead-in to eliminate stubbing during the placement of the electrical connector 1 onto the printed circuit board 8. Thus, the carrier strip 46 of the ground bus 4 is removed after the connector 1 is soldered on the printed circuit board 8.

It is appreciated that during the assembly of the connector 1 to the printed circuit board 8, the anchor clips 6 of the connector 1 are first received in the channels 80 of the printed circuit board 8, the terminal portions 32 of the signal contacts 3 then contact with the signal pads 82 on the printed circuit board 8, and the solder tails 42 of the ground buses 4 finally and easily contact with the ground pads 84 on the printed circuit board 8 via the lead-in 424 of the ground bus 4. At the same time, the signal contacts 3 are kept between the fingers 460 of the ground buses 4 at all times. Thus, the terminal portions 32 of the signal contacts 3 are accurately aligned with the signal pads 82 on the printed circuit board 8.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of making an electrical connector, comprising steps of:

providing an insulative housing assembly;

attaching a grounding bus to the housing assembly, said grounding bus including a plurality of fingers extending forwardly from a carrier of said grounding bus wherein some of said fingers further include solder tails extending into the housing;

inserting a plurality of signal contacts into the housing assembly, a tail of each of said signal contacts sandwiched between every adjacent two of all said fingers;

assembling a printed circuit board forwardly to housing, said printed circuit board soldered with the tails of the signal contacts and the solder tails of the grounding bus; and removing said carrier with said fingers.

2. The method of claim 1, wherein said tails of the signal contacts and the fingers extend in a non-parallel manner with each other.

\* \* \* \* \*